United States Patent
Usuki et al.

(10) Patent No.: US 7,459,047 B2
(45) Date of Patent: Dec. 2, 2008

(54) PREPARATION OF FLEXIBLE COPPER FOIL/POLYIMIDE LAMINATE

(75) Inventors: Masahiro Usuki, Kashima-gun (JP); Makoto Fujiwara, Kashima-gun (JP); Shigehiro Hoshida, Kashima-gun (JP); Michio Aizawa, Kashima-gun (JP); Tadashi Amano, Kashima-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 310 days.

(21) Appl. No.: 11/194,606

(22) Filed: Aug. 2, 2005

(65) Prior Publication Data
US 2006/0042750 A1 Mar. 2, 2006

(30) Foreign Application Priority Data
Aug. 31, 2004 (JP) ............... 2004-251735

(51) Int. Cl.
*B29C 65/52* (2006.01)
*B32B 15/08* (2006.01)

(52) U.S. Cl. ............... 156/87; 156/233; 156/237; 156/331.1; 428/458

(58) Field of Classification Search ............... 156/87, 156/233, 237, 309.3, 330.9, 331.1; 428/458, 428/473.5
See application file for complete search history.

(56) References Cited

U.S. PATENT DOCUMENTS 3,449,193 A * 6/1969 Bratton et al. ............... 156/87
3,998,601 A * 12/1976 Yates et al. ............... 428/607
4,022,649 A * 5/1977 Nakagome et al. ........ 156/182
4,839,232 A * 6/1989 Morita et al. ............ 428/473.5
5,043,227 A * 8/1991 Perry et al. ............... 428/463
2004/0265601 A1 12/2004 Hoshida et al.
2005/0121138 A1 6/2005 Hoshida et al.
2005/0181223 A1 8/2005 Aizawa et al.

FOREIGN PATENT DOCUMENTS

| JP | 4-340791 | 11/1992 |
| JP | 8-162734 | 6/1996 |
| JP | 2001-102693 | 4/2001 |
| JP | WO 2005/000562 A1 * | 1/2005 |

* cited by examiner

*Primary Examiner*—Richard Crispino
*Assistant Examiner*—Michael A Tolin
(74) *Attorney, Agent, or Firm*—Oblon, Spivak, McClelland, Maier & Neustadt, P.C.

(57) ABSTRACT

A flexible metal foil/polyimide laminate is prepared by applying a polyamic acid varnish onto a very thin copper foil on a carrier, semi-drying the varnish, laminating a polyimide film to the varnish-coated copper foil using a hot roll press, and heat treating the laminate for solvent removal and imidization in an atmosphere having a controlled oxygen concentration. A polyimide adhesive layer resulting from the imidization of polyamic acid has a thickness of up to 6 μm, the sum of the thicknesses of the polyimide film and the polyimide adhesive layer is up to 25 μm. The polyimide adhesive layer has a Tg>400° C.

25 Claims, No Drawings

US 7,459,047 B2

PREPARATION OF FLEXIBLE COPPER FOIL/POLYIMIDE LAMINATE

CROSS-REFERENCE TO RELATED APPLICATION

This non-provisional application claims priority under 35 U.S.C. §119(a) on Patent Application No. 2004-251735 filed in Japan on Aug. 31, 2004, the entire contents of which are hereby incorporated by reference.

TECHNICAL FIELD

This invention relates to a method for preparing a flexible copper foil/polyimide laminate in which a very thin metal foil is laminated on one surface of a polyimide film via a heat resistant polyimide adhesive layer.

BACKGROUND ART

While there are increasing demands for mobile phones and flat panel displays, flexible copper foil/polyimide laminates used therein are strongly required to achieve a higher density. It is thus required to miniaturize circuitry patterns and reduce the laminate gage. To meet such requirements, laminates are prepared by using a very thin copper foil as the conductor layer and laminating it to a polyimide film via various adhesives. For example, JP-A 4-340791 describes the use of an adhesive based on nylon/brominated epoxy/phenolic resin; JP-A 8-162734 describes the use of an adhesive layer of thermoplastic polyimide; and JP-A 2001-102693 describes the use of an epoxy/nitrile rubber adhesive. Flexible copper foil/polyimide laminates having very thin copper foil laminated with such adhesives, however, suffer from several problems. The adhesive layers are more than 10 µm and the resulting laminates are also relatively thick. The laminates are less resistant to folding and less flexible. The laminates have poor high-temperature properties since the adhesives have a glass transition temperature (Tg) of less than 300° C.

SUMMARY OF THE INVENTION

An object of the present invention is to provide a method for preparing a flexible copper foil/polyimide laminate having a reduced overall thickness while taking advantage of the characteristics of heat resistant polyimide resin film including heat resistance, flame retardance, flexibility, folding endurance and electrical properties.

According to the invention, a method for preparing a flexible metal foil/polyimide laminate is provided comprising the steps of applying a polyamic acid varnish onto a very thin copper foil having a thickness of up to 9 µm supported on a carrier, semi-drying the varnish until a solvent content of the varnish becomes 30 to 200% by weight based on varnish solids, laminating a polyimide film to the varnish-coated copper foil using a hot roll press, and heat treating the laminate for removing the residual solvent in the varnish and imidizing the polyamic acid. The heat treatment of the laminate is carried out in an atmosphere having an oxygen concentration of up to 2% by volume. A polyimide adhesive layer resulting from the imidization of polyamic acid has a thickness of up to 6 µm. The sum of the thickness of the polyimide film and the thickness of the polyimide adhesive layer is up to 25 µm. The polyimide adhesive layer has a glass transition temperature of higher than 400° C.

According to the invention, a flexible metal foil/polyimide laminate of all polyimide type and reduced overall thickness is prepared by the laminating process and it has improved folding endurance and flexural properties at elevated temperatures.

DETAILED DESCRIPTION OF THE INVENTION

As used herein, the very thin copper foil refers to a structure in which an electrolytic copper foil having a thickness equal to or less than 9 µm is deposited on a carrier layer in the form of metal foil having a thickness equal to or greater than 35 µm, such as copper or aluminum foil, via a release layer having a thickness of about 10 to 100 angstroms, by an electrolytic plating process. For the carrier layer, metal foils having a thickness equal to 35 µm are commercially available. In the case of lamination by means of a hot roll press, it is recommended to use as the carrier layer a rolled copper foil which is of the same material as the very thin copper foil because the difference in coefficient of thermal expansion upon heating between the very thin copper foil and the carrier layer is minimized, avoiding the risk that the very thin copper foil is partially peeled from the carrier layer during the hot roll-assisted laminating step. The very thin copper foil used herein should have a thickness equal to or less than 9 µm. When it is desired to form fine patterns having circuit widths and intervals equal to or less than 60 µm, for example, a copper foil having a thickness equal to or less than 5 µm is preferred because of minimized root residues after etching. The lower limit of the thickness of the very thin copper foil may be determined as appropriate, and typically at least 3 µm.

The very thin copper foil supported on a carrier is commercially available, for example, under the trade name of Micro Thin® from Mitsui Kinzoku Corporate.

According to the invention, a polyamic acid varnish is applied onto the electrolytic copper foil (very thin copper foil) of the carrier-supported very thin copper foil structure in order to form a polyimide adhesive layer thereon.

The polyamic acid used as the adhesive is preferably one prepared by reacting an aromatic tetracarboxylic acid anhydride with an aromatic diamine compound optionally in a solvent. The acid anhydrides used herein include tetracarboxylic acid anhydrides and derivatives thereof. Reference is made to tetracarboxylic acids although corresponding esters, acid anhydrides and acid chlorides may, of course, be used. Examples of suitable tetracarboxylic acids include pyromellitic acid, 3,3',4,4'-biphenyltetracarboxylic acid, 3,3',4,4'-benzophenonetetracarboxylic acid, 3,3',4,4'-diphenylsulfonetetracarboxylic acid, 3,3',4,4'-diphenylethertetracarboxylic acid, 2,3,3',4'-benzophenonetetracarboxylic acid, 2,3,6,7-naphthalenetetracarboxylic acid, 1,2,5,6-naphthalenetetracarboxylic acid, 3,3',4,4'-diphenylmethanetetracarboxylic acid, 2,2-bis(3,4-dicarboxyphenyl)propane, 2,2-bis(3,4-dicarboxyphenyl)hexafluoropropane, 3,4,9,10-tetracarboxyperylene, 2,2-bis[4-(3,4-dicarboxyphenoxy)phenyl]propane, 2,2-bis[4-(3,4-dicarboxyphenoxy)phenyl]hexafluoropropane, butanetetracarboxylic acid, and cyclopentanetetracarboxylic acid. Trimellitic acid and derivatives thereof are also included.

The tetracarboxylic acids may be modified with compounds having reactive functional groups to incorporate a crosslinked or ladder structure.

Examples of suitable diamines used herein include diamines such as p-phenylenediamine, m-phenylenediamine, 2'-methoxy-4,4'-diaminobenzanilide, 4,4'-diaminodiphenyl ether, diaminotoluene, 4,4'-diaminodiphenylmethane, 3,3'-dimethyl-4,4'-diaminodiphenylmethane, 2,2-bis[4-(4-aminophenoxy)phenyl]propane, 1,2-bis(anilino)ethane, diaminodiphenylsulfone, diaminobenzanilide, diaminobenzoate, diaminodiphenyl sulfide, 2,2-bis(p-aminophenyl)propane, 2,2-bis(p-aminophenyl)hexafluoropropane, 1,5-diaminonaphthalene, diaminotoluene, diaminobenzotrifluoride, 1,4-bis(p-aminophenoxy)benzene, 4,4'-(p-aminophenoxy)biphenyl, diaminoanthraquinone, 4,4'-bis(3-aminophenoxyphenyl)diphenylsulfone, 1,3-bis(anilino)hexafluoropropane, 1,4-bis(anilino)octafluoropropane, 1,5-bis(anilino)decafluoropropane, 1,7-bis(anilino)tetradecafluoropropane, 2,2-bis[4-(p-aminophenoxy)phenyl]hexafluoropropane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]-hexafluoropropane, 2,2-bis[4-(4-aminophenoxy)-3,5-ditrifluoromethylphenyl]-hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenylsulfone, 4,4'-bis(4-amino-5-trifluoromethylphenoxy)diphenylsulfone, 2,2-bis[4-(4-amino-3-trifluoromethylphenoxy)phenyl]-hexafluoropropane, benzidine, 3,3',5,5'-tetramethylbenzidine, octafluorobenzidine, 3,3'-methoxybenzidine, o-tolidine, m-tolidine, 2,2',5,5',6,6'-hexafluorotolidine, 4,4''-diaminoterphenyl, 4,4'''-diaminoquarterphenyl; diisocyanates obtained by reaction of the foregoing diamines with phosgene or the like; and diaminosiloxanes.

Examples of suitable solvents include N-methylpyrrolidone (NMP), dimethylformamide (DMF), dimethylacetamide (DMAc), dimethyl sulfoxide (DMSO), dimethyl sulfate, sulfolane, butyrolactone, cresol, phenol, halogenated phenols, cyclohexanone, dioxane, tetrahydrofuran, and diglyme.

The polyamic acid used herein as the adhesive is to form a polyimide adhesive layer possessing an identical or equivalent chemical structure and properties to the polyimide film used in the laminate as will be described later, and also having a glass transition temperature (Tg)>400° C. In this regard, preferred polyamic acids used herein are those resulting from condensation of pyromellitic anhydride or 3,4,3',4'-biphenyltetracarboxylic anhydride or mixtures thereof as the acid anhydride with 4,4'-diaminodiphenyl ether or p-phenylenediamine or mixtures thereof as the diamine. Condensation reaction is advantageously performed in a polar solvent of DMAc, NMP or a mixture of DMAc and NMP, under conditions including a reaction temperature of 10 to 40° C., a reaction solution concentration of up to 30% by weight, a molar ratio of aromatic tetracarboxylic anhydride to aromatic diamine between 0.95:1.00 and 1.05:1.00, and a N$_2$ atmosphere. It is understood that the methods of dissolving and adding the reactants are not particularly limited.

In the practice of the invention, a copolymer or blend of polyamic acids which are obtained from the above condensates can be used as well. For the purposes of improving various properties, inorganic, organic or metallic materials in powder or fibrous form may be used in combination with the polyamic acid. It is also acceptable to add various additives, for example, antioxidants for preventing the conductor from oxidation, silane coupling agents for improving adhesion, and polymers of different type for improving adhesion or the like.

The method for preparing a flexible metal foil/polyimide laminate according to the invention involves the steps of applying or casting a polyamic acid varnish onto the very thin copper foil so as to form a layer having a thickness of up to 6 μm, preferably up to 5 μm after imidization. The lower limit of the thickness of the polyimide adhesive layer may be determined as appropriate, and typically at least 2 μm.

After the application, the varnish coating is semi-dried until a solvent content of the varnish becomes 30 to 200% by weight, and preferably 40 to 100% by weight, based on varnish solids. A polyimide film is then laminated thereto by means of a hot roll press. If the varnish coating has been over-dried to a varnish solvent content of less than 30% by weight at this point, it provides insufficient bonding to the polyimide film by the laminating operation. Inversely, in the case of short-drying to a varnish solvent content of more than 200% by weight, blister can occur due to foaming of the adhesive layer during the laminating operation or subsequent heat treatment. In the drying step, it is preferred to set the drying temperature at an insufficient level to induce imidization to the polyamic acid, preventing the adhesive layer from substantially contracting and deforming together with the copper foil during the drying step. Specifically, the drying temperature is preferably equal to or lower than 200° C.

When the polyimide film is laminated to the polyamic acid varnish in the semi-dry state, any commercially available polyimide films may be used. Examples of commercially available polyimide films include Kapton V, Kapton H and Kapton EN from Toray-Dupont Co., Ltd., Apical AH and Apical NPI from Kaneka Corp.

In the flexible copper foil/polyimide laminate of the invention, the thickness of the polyimide layer which is the polyimide adhesive layer plus the polyimide film should be equal to or less than 25 μm, preferably equal to or less than 20 μm. This is determined in view of flexural properties, folding endurance, thickness after multilayer lamination, and the like. Hence, the polyimide adhesive layer and the polyimide film are preferably combined such that the sum of their thicknesses is equal to or less than 25 μm, especially equal to or less than 20 μm. The lower limit of the thickness of the polyimide layer is preferably at least 10 μm.

The method for preparing a flexible copper foil/polyimide laminate according to the invention involves the steps of casting a polyamic acid varnish onto a copper foil so as to form a layer having a thickness of up to 5 μm after imidization, partially drying the varnish coating at a temperature of not higher than 200° C. insufficient to induce imidization until a solvent content of 30 to 200% by weight is reached, laminating a polyimide film thereto on a hot roll press, and heat treating the laminate for solvent removal and imidization. In this way, an all polyimide flexible copper foil laminate having improved folding endurance and flexural properties can be prepared without detracting from the heat resistance and other properties of the adhesive as are problematic in the prior art.

In the method of the invention, the polyamic acid varnish is applied to the exposed surface of a very thin copper foil and dried, followed by roll lamination and heat treatment for imidization. The apparatus and technique used in this step are not particularly limited. Application may be done using comma coaters, T dies, roll coaters, knife coaters, reverse coaters, lip coaters or the like. The means of heating the roll press include direct heating of rolls with oil, steam or heating media. As to the roll material, use may be made of metal rolls such as carbon steel, and rubber rolls such as heat resistant fluoro rubber or silicone rubber. The roll pressing conditions are not particularly limited. The roll temperature is typically below the boiling point of the solvent for polyamic acid such as DMAc or NMP, specifically from 100 to 150° C. The linear pressure is typically in a range of 5 to 100 kg/cm.

With respect to the heat treatment for drying (solvent removal) and imidization following lamination, the temperature and time may be determined sufficient to remove the solvent and water, typically 160 to 350° C. and 3 to 40 hours because the residual solvent in the polyimide adhesive layer and the water by-product of imidization escape through the overlying polyimide film. In order to prevent the very thin copper foil from oxidation and the release layer between the very thin copper foil and the carrier from thermal degradation, the heat treatment should preferably be carried out in a reduced pressure or nitrogen atmosphere having an oxygen concentration of up to 2% by volume.

During the heat treatment, the laminate may take a sheet or roll form. In the case of roll form, how to wind into a roll is not critical, for example, the copper foil may be either inside or outside, and a spacer may be interleaved. In the inventive method, the laminate in the preferred form of a loosely wound roll or a roll with a spacer of different material interleaved may be subjected to heat treatment for more efficient removal of the residual solvent and by-product water. Any spacer may be used herein as long as it has such a structure that a space is provided between adjacent turns and is made of a material which does not alter at the heat treatment temperature.

EXAMPLE

Examples of the invention are given below together with Comparative Example by way of illustration and not by way of limitation.

Examples 1 and 2

Adhesive A

A three-necked flask equipped with a stirrer and a dropping funnel was immersed in an ice water bath and purged with nitrogen gas. To the flask, 30.0 g of 3,3',4,4'-biphenyltetracarboxylic dianhydride and 200 g of dimethylacetamide (DMAc) were added and stirred for 30 minutes. From the dropping funnel, 10.8 g of p-phenylenediamine in 200 g of DMAc was added dropwise over 15 minutes. The mixture was stirred for 2 hours at 10-15° C. and for a further 6 hours at 25° C., yielding a uniform varnish comprising polyamic acid.

Adhesive B

A 30% solution was prepared by dissolving 100 g of Nipol 1072J (by Zeon Corp., acrylonitrile-butadiene rubber (NBR)), 50 g of Epikote 828 (by Japan Epoxy Resin Co., Ltd., bisphenol A type epoxy resin), and 7 g of 4,4'-diaminodiphenylsulfone in DMAC.

Preparation of Laminate

Using an applicator, Adhesive A was applied onto a 30 cm×25 cm piece of a very thin copper foil Micro Thin® (by Mitsui Kinzoku Corporate, very low profile 3 μm copper foil on a 35 μm copper peelable carrier) so that the thickness shown in Table 1 was reached after imidization. The coating was dried in a clean oven at 120° C. for 5 minutes. The amount of residual solvent in the polyamic acid layer (varnish solvent content per varnish solids) is also shown in Table 1. A 30 cm×25 cm piece of a polyimide film (Apical NPI) having the thickness shown in Table 1 was overlaid on the varnish coat. Using a test roll laminator (Nishimura Machinery Co., Ltd.), the laminate form was pressed at 120° C., a pressure of 15 kg/cm and a rate of 4 m/min. In a vacuum oven, the laminate form was heat treated at 1 Torr and 350° C. for 6 hours. The resulting laminate included a polyimide layer (adhesive layer+polyimide film) of 17 μm thick and had a thickness of 20 μm excluding the carrier.

Glass Transition Temperature (Tg)

Each of the varnishes used in Examples and Comparative Examples was applied onto a glass plate and dried at 120° C. for 10 minutes. The coat was peeled from the glass plate and heated at 1 Torr and 350° C. for 6 hours for imidization, forming a sheet of 25 μm thick. The glass transition temperature (Tg) of the sheet was measured using a thermal analyzer RSA-III (Rheometric Scientific Inc.).

MIT Folding Endurance

On a laminate, a circuit was defined according to JIS C6471. In a folding test under conditions: folding radius 0.8 mm, folding rate 175 cycles/min, and load 250 g, the number of folds in MD was counted.

IPC Flexibility

From the laminate, the carrier and the release layer were removed. A circuit pattern was defined on the very thin copper foil of the laminate according to IPC FC241. With the very thin copper foil faced outside, the laminate was subjected to a repetitive flex test under conditions: temperature 80° C., flex radius 1.5 mm, flexing rate 1,500 cycles/min, and stroke 20 mm. The number of flexes when the resistivity of the circuit exceeded 10% or when the circuit was broken was counted.

Comparative Example 1

A laminate was prepared as in Example 1 except that a polyimide film (Apical NIP) of 50 μm thick was used.

Comparative Example 2

A laminate was prepared as in Example 1 except that the adhesive layer after imidization was 15 μm thick.

Comparative Example 3

A laminate was prepared as in Example 1 except that the adhesive layer after imidization was 8 μm thick and a polyimide film (Apical NIP) of 25 μm thick was used.

Comparative Example 4

A laminate was prepared as in Example 1 except that Adhesive B was used.

Comparative Example 5

A laminate was prepared as in Example 1 except that the heat treatment after lamination was carried out in a $N_2$ inert oven at an oxygen concentration of 2.3% by volume.

TABLE 1

|  | Example | | Comparative Example | | | | |
| --- | --- | --- | --- | --- | --- | --- | --- |
|  | 1 | 2 | 1 | 2 | 3 | 4 | 5 |
| Adhesive (varnish) | A | A | A | A | A | B | A |
| Residual solvent upon lamination, wt % | 70 | 70 | 40 | 150 | 130 | 90 | 70 |

TABLE 1-continued

|  | Example | | Comparative Example | | | | |
|---|---|---|---|---|---|---|---|
|  | 1 | 2 | 1 | 2 | 3 | 4 | 5 |
| Thickness of adhesive layer after imidization, μm | 2 | 5 | 2 | 15 | 8 | 5 | 4 |
| Adhesive layer Tg, ° C. | 420 | 420 | 420 | 420 | 420 | 45 | 420 |
| Thickness of Apical NPI, μm | 13 | 13 | 50 | 13 | 25 | 13 | 13 |
| Thickness of Cu foil, μm | 3 | 3 | 3 | 3 | 3 | 3 | 3 |
| Thickness of polyimide layer, μm | 15 | 18 | 52 | 28 | 33 | 17 | 20 |
| $O_2$ concentration during heat treatment, vol % | <0.1 | <0.1 | <0.1 | <0.1 | <0.1 | <0.1 | 2.3 |
| MIT folding endurance | 3,350 | 2,750 | 15 | 370 | 480 | 950 | 250 |
| IPC flexural resistance, ×$10^5$ | 90 | 125 | 5 | 49 | 29 | 33 | 3 |

Japanese Patent Application No. 2004-251735 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing a flexible metal foil/polyimide laminate, comprising:
    applying a polyamic acid varnish onto a very thin copper foil having a thickness of up to 9 μm supported on a carrier,
    semi-drying the varnish until a solvent content of the varnish becomes 40 to 100% by weight based on varnish solids,
    laminating a polyimide film to the varnish-coated copper foil using a hot roll press, and
    heat treating the laminate for removing the residual solvent in the varnish and imidizing the polyamic acid in an atmosphere having an oxygen concentration of up to 2% by volume,
    wherein a polyimide adhesive layer resulting from the imidization of polyamic acid has a thickness of up to 6 μm, the sum of the thickness of the polyimide film and the thickness of the polyimide adhesive layer is up to 25 μm, and the polyimide adhesive layer has a glass transition temperature of higher than 400° C.

2. The method of claim 1, wherein said carrier is a copper foil or an aluminum foil, wherein said carrier has a thickness of at least 35 μm.

3. The method of claim 2, wherein said carrier is a copper foil.

4. The method of claim 1, wherein said very thin copper foil has a thickness of up to 5 μm.

5. The method of claim 1, wherein said very thin copper foil has a thickness of 3 μm to 9 μm.

6. The method of claim 1, wherein the polyamic acid in said polyamic acid varnish is prepared by reacting an aromatic tetracarboxylic acid anhydride with an aromatic diamine compound.

7. The method of claim 6, wherein said aromatic tetracarboxylic acid anhydride is an acid anhydride of a tetracarboxylic acid selected from the group consisting of pyromellitic acid, 3,3',4,4'-biphenyltetracarboxylic acid, 3,3',4,4'-benzophenonetetracarboxylic acid, 3,3',4,4'-diphenylsulfonetetracarboxylic acid, 3,3',4,4'-diphenylethertetracarboxylic acid, 2,3,3',4'-benzophenonetetracarboxylic acid, 2,3,6,7-naphthalenetetracarboxylic acid, 1,2,5,6-naphthalenetetracarboxylic acid, 3,3',4,4'-diphenylmethanetetracarboxylic acid, 2,2-bis(3,4-dicarboxyphenyl)propane, 2,2-bis (3,4-dicarboxyphenyl)hexafluoropropane, 3,4,9,10-tetracarboxyperylene, 2,2-bis [4-(3,4-dicarboxyphenoxy)phenyl]propane, 2,2-bis[4-(3,4-dicarboxyphenoxy)phenyl] hexafluoropropane, butanetetracarboxylic acid, and cyclopentanetetracarboxylic acid.

8. The method of claim 7, wherein said tetracarboxylic acids are modified with compounds having reactive functional groups to incorporate a crosslinked or ladder structure.

9. The method of claim 6, wherein said aromatic diamine is selected from the group consisting of p-phenylenediamine, m-phenylenediamine, 2'-methoxy-4,4'-diaminobenzanilide, 4,4'-diaminodiphenyl ether, diaminotoluene, 4,4'-diaminodiphenylmethane, 3,3'-dimethyl-4,4'-diaminodiphenylmethane, 2,2-bis[4-(4-aminophenoxy)phenyl]propane, 1,2-bis(anilino)ethane, diaminodiphenylsulfone, diaminobenzanilide, diaminobenzoate, diaminodiphenyl sulfide, 2,2-bis(p-aminophenyl)propane, 2,2-bis(p-aminophenyl)hexafluoropropane, 1,5-diaminonaphthalene, diaminotoluene, diaminobenzotrifluoride, 1,4-bis(p-aminophenoxy)benzene, 4,4'-(p-aminophenoxy)biphenyl, diaminoanthraquinone, 4,4'-bis(3-aminophenoxyphenyl)diphenylsulfone, 1,3-bis(anilino)hexafluoropropane, 1,4-bis(anilino)octafluoropropane, 1,5-bis(anilino)decafluoropropane, 1,7-bis(anilino)tetradecafluoropropane,2,2-bis[4-(p-aminophenoxy)phenyl]hexafluoropropane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]-hexafluoropropane, 2,2-bis[4-(4-aminophenoxy)-3,5-ditrifluoromethylphenyl]-hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenylsulfone, 4,4'-bis(4-amino-5-trifluoromethylphenoxy)diphenylsulfone, 2,2-bis[4-(4-amino-3-trifluoromethylphenoxy)phenyl] hexafluoropropane, benzidine, 3,3',5,5'-tetramethylbenzidine, octafluorobenzidine, 3,3'-methoxybenzidine, o-tolidine, m-tolidine, 2,2',5,5',6,6'-hexafluorotolidine, 4,4"-diaminoterphenyl, 4,4'''-diaminoquarterphenyl, diisocyanates obtained by reaction of the foregoing diamines with phosgene, and diaminosiloxanes.

10. The method of claim 6, wherein said aromatic tetracarboxylic acid anhydride is pyromellitic anhydride or 3,4,3',4'-biphenyltetracarboxylic anhydride or mixtures thereof and said aromatic diamine compound is 4,4'-diaminodiphenyl ether or p-phenylenediamine or mixtures thereof.

11. The method of claim 6, wherein said reacting is in the presence of a solvent.

12. The method of claim 11, wherein said solvent is selected from the group consisting of N-methylpyrrolidone (NMP), dimethylformamide (DMF), dimethylacetamide (DMAc), dimethyl sulfoxide (DMSO), dimethyl sulfate, sulfolane, butyrolactone, cresol, phenol, halogenated phenols, cyclohexanone, dioxane, tetrahydrofuran, and diglyme.

13. The method of claim 11, wherein said solvent is N-methylpyrrolidone (NMP), dimethylacetamide (DMAc), or a mixture thereof, and said reacting is performed at a reaction temperature of 10 to 40° C., at a reaction solution concentration of up to 30% by weight, a molar ratio of aromatic tetracarboxylic anhydride to aromatic diamine between 0.95:1.00 and 1.05:1.00, and in a $N_2$ atmosphere.

14. The method of claim 1, wherein said polyamic acid varnish further comprises additives selected from the group consisting of antioxidants, silane coupling agents, and adhesion-improving polymers.

15. The method of claim 1, wherein said polyimide adhesive layer resulting from the imidization of polyamic acid has a thickness of up to 5 μm.

16. The method of claim 1, wherein said polyimide adhesive layer resulting from the imidization of polyamic acid has a thickness of 2 μm to 6 μm.

17. The method of claim 1, wherein said semi-drying is at a drying temperature of no more than 200° C.

18. The method of claim 1, wherein the sum of the thickness of the polyimide film and the thickness of the polyimide adhesive layer is up to 20 μm.

19. The method of claim 1, wherein the sum of the thickness of the polyimide film and the thickness of the polyimide adhesive layer is 10 μm to 25 μm.

20. The method of claim 1, wherein said applying is by using an apparatus selected from the group consisting of a comma coater, a T die, a roll coater, a knife coater, a reverse coater, and a lip coater.

21. The method of claim 1, wherein said laminating is by roll lamination wherein the roll temperature ranges from 100 to 150° C. and the linear pressure ranges from 5 to 100 kg/cm.

22. The method of claim 1, wherein said heat treating is at a temperature ranging from 160 to 350° C. and for a time ranging from 3 to 40 hours.

23. The method of claim 22, wherein said heat treating is performed in a reduced pressure or nitrogen atmosphere having an oxygen concentration of up to 2% by volume.

24. The method of claim 1, wherein during said heat treating the laminate is either in a form of a sheet or a roll.

25. The method of claim 24, wherein during said heat treating the laminate is a loosely wound roll or a roll with a spacer of a different material from said laminate interleaved.

* * * * *